US005635854A

United States Patent [19]
Shimanek et al.

[11] Patent Number: 5,635,854
[45] Date of Patent: Jun. 3, 1997

[54] PROGRAMMABLE LOGIC INTEGRATED CIRCUIT INCLUDING VERIFY CIRCUITRY FOR CLASSIFYING FUSE LINK STATES AS VALIDLY CLOSED, VALIDLY OPEN OR INVALID

[75] Inventors: Schuyler E. Shimanek, Albuquerque; Alma Anderson, Rio Rancho, both of N.M.

[73] Assignee: Philips Electronics North America Corporation, New York, N.Y.

[21] Appl. No.: 247,934

[22] Filed: May 24, 1994

[51] Int. Cl.⁶ ...................... H03K 19/177; H01H 85/30
[52] U.S. Cl. .................. 326/38; 326/9; 326/16; 327/525; 324/55; 324/713
[58] Field of Search .................. 326/9–10, 13, 326/16; 3/38, 39; 327/525; 324/550, 158 R, 713

[56] References Cited

U.S. PATENT DOCUMENTS

| | | | |
|---|---|---|---|
| 4,625,162 | 11/1986 | Bosnyak | 324/51 |
| 4,698,589 | 10/1987 | Blankenship | 324/158 R |
| 4,730,129 | 3/1988 | Kunitoki | 327/525 |
| 4,730,273 | 3/1988 | Sluss | 365/96 |
| 4,864,165 | 9/1989 | Hoberman | 326/16 |
| 5,140,554 | 8/1992 | Schreck et al. | 365/201 |
| 5,291,139 | 3/1994 | Fruhauf | 327/525 |
| 5,404,049 | 4/1995 | Canada | 327/525 |
| 5,453,696 | 9/1995 | Becker | 327/525 |

FOREIGN PATENT DOCUMENTS

| | | |
|---|---|---|
| 0090332 | 10/1983 | European Pat. Off. . |
| 0120485 | 10/1984 | European Pat. Off. . |
| 0161947 | 7/1991 | European Pat. Off. . |
| 0492337 | 12/1991 | European Pat. Off. . |
| 2253489 | 9/1992 | United Kingdom . |

*Primary Examiner*—Edward P. Westin
*Assistant Examiner*—Benjamin D. Driscoll

[57] ABSTRACT

A programmable logic device (PLD) integrated circuit containing an array of fuse or anti-fuse links includes verification circuitry configured to classify link resistances after programing into three resistance zones, corresponding to a "closed" state zone, an "open" state zone and a "forbidden" state zone intermediate the "closed" and "open" state zones. Two reference resistance values, namely a lower reference resistance value and the higher reference resistance value, divide the entire range of possible link resistance values into the aforementioned three resistance zones. Because the ratio between the higher reference resistance value and the lower reference resistance value is typically more than 50, the verification circuitry includes a switchable two level current source that produces a voltage across the link of correct dynamic range. A measurement voltage produced in response to the link voltage is compared by a pair of differential comparators to respective lower and higher reference voltages, the lower reference voltage corresponding to the measurement voltage that would be produced by a higher link voltage that is the product of the higher reference resistance value and the lower current level, and the higher reference voltage corresponding to the measurement voltage that would be produced by a lower link voltage that is the product of the lower reference resistance value and the higher current level.

10 Claims, 3 Drawing Sheets

PROGRAMMABLE LOGIC INTEGRATED CIRCUIT INCLUDING VERIFY CIRCUITRY FOR CLASSIFYING FUSE LINK STATES AS VALIDLY CLOSED, VALIDLY OPEN OR INVALID

BACKGROUND OF THE INVENTION

1. Field of the Invention

The present invention relates to programmable logic devices (PLD's) of a type in which an internal memory of fuse or anti-fuse links is programable via program/verify f(P/V) circuitry to achieve a desired pattern of "open" and "closed" link states which are verifiable via the P/V circuitry.

2. Description of the Related Art

Programmable logic devices (PLD's) include a family of integrated circuits (IC's) with an internal memory array of links of a fuse or an anti-fuse type. A memory array of links of the fuse type has all link states originally "closed" while an array of links of the anti-fuse type has all link states originally "open". The array is programmed in response to high power programming pulses to contain a desired pattern of "open" and "closed" link states in order to customize the PLD's functionality. As a result of the programing, specific links are intended to be brought irreversibly and completely to a state opposite their original state.

While ideally "closed" links should have a zero resistance and "open" links an infinite resistance, this is not achievable in practice. Because zero resistance materials are not available at the operating temperatures of integrated circuits, typically the resistance of a "closed" or intact link may range up to 100Ω while a distribution of resistance of an "open" link may range from 100 MΩ down to below 100Ω.

Through proper design and testing methodologies, integrated circuits with link resistance values that would adversely affect functionality can be rejected. Current testing philosophies include a verification during which the links are sequentially selected and the resistance of each selected link is compared with a single reference resistance value, for example 500 KΩ, to classify the link resistance among two resistance zones divided by the reference value, i.e. one resistance zone corresponding to a "closed" or "intact" state and the other resistance zone corresponding to an "open" state. If the resistance of a link is greater than the reference resistance value, the link is considered in the "open" state, otherwise the link is considered in the "closed" state.

Links whose resistance approach the ideally "closed" value of zero or the ideally "open" value of infinity pose no problem. However, as link resistance approaches the reference resistance value, functional and AC failures, which are not usually tested for during or after programing, may result. Functional and AC testing, beyond the usual room temperature functional test, sufficient to identify these possible failures would be unduly costly.

SUMMARY OF THE INVENTION

It is an object of the present invention to provide a programmable logic device integrated circuit having verification circuitry configured such that all IC's that pass both programming verification and room temperature functional test are virtually guaranteed to function as programmed.

It is a further object of the present invention to provide a programmable logic device having verification circuitry configured to classify link resistances into three rather than two resistance zones, corresponding to a "validly closed" state zone, a "validly open" state zone and an "invalid" or "forbidden" state zone intermediate the "validly closed" and "validly open" state zones.

It is yet another object of the present invention to provide such verification circuitry in integrated circuits of various types, including bipolar and biCMOS.

Briefly, these and other objects of the present invention are satisfied by utilizing two reference resistance values, namely a lower reference resistance value and a higher reference resistance value, to divide the entire range of possible link resistance values into the aforementioned three resistance zones. Because the quotient of the higher reference resistance value and the lower reference resistance value is typically more than 50, for example 200, the verification circuitry includes a switchable two level current source. In order to produce test voltages across the links (link voltages) of correct dynamic range, the current source produces a predetermined constant higher current through those links having a resistance less than or equal to the lower reference resistance value and a predetermined constant lower current through those links having a resistance greater than or equal to the higher reference resistance value. The quotient between the higher and lower current levels is preferably about one quarter of the quotient between the higher and lower reference resistance values.

A measurement voltage at a node which is produced in response to the link voltage is compared by differential comparator means to respective lower and higher reference voltages, the lower reference voltage corresponding to the measurement voltage that would be produced by a higher link voltage which is the product of the higher reference resistance value and the lower current level, and the higher reference voltage corresponding to the measurement voltage that would be produced by a lower link voltage which is the product of the lower reference resistance value and the higher current level. It should be appreciated that the quotient of the higher and lower link voltages equals the quotient of the higher and lower reference resistance values divided by the quotient of the higher and lower current levels.

In accordance with a first embodiment of the invention useful for a bipolar implementation, the switchable current source is configured to automatically switch a relatively high current source out of the circuit with a selected link as long as the link voltage exceeds the higher link voltage, thereby clamping the link voltage to the higher link voltage for a link resistance of the selected link in the range less than or equal to the higher reference resistance value and greater than or equal to the quotient of the higher link voltage and the higher current level. Consequently, the link voltage of the selected link will exceed the higher link voltage only when the link resistance exceeds the higher reference resistance value and the link voltage will be less than the lower link voltage only when the link resistance is less than the lower reference resistance value.

In accordance with a second embodiment of the invention useful for a biCMOS implementation, the switchable current source is configured to switch a relatively high current source into the circuit with a selected link during a strobe signal. Otherwise, only a relatively low current source is in the circuit with the selected link. The comparator means is configured to be active for comparison of the measurement voltage with the lower reference voltage only in the absence of the strobe signal and for comparison of the measurement voltage with the higher reference voltage only during the strobe signal.

However done, the results of the comparisons of the measurement voltage with the lower and higher reference voltages enable formation of digital signals classifying the link resistance of the selected link among a "validly closed" state zone, a "validly open" state zone and an "invalid" state zone intermediate the "validly closed" and "validly open" state zones. The "invalid" state zone is chosen to be of sufficient extent to ensure that a PLD having all its link resistance values verified as lying in the "validly closed" and "validly open" state zones is virtually guaranteed to operate as programmed, providing it passes the usual room temperature functional test.

Other objects, features and advantages of the present invention will become apparent upon perusal of the following detailed description when taken in conjunction with the appended drawing, wherein:

DETAILED DESCRIPTION OF THE PREFERRED EMBODIMENTS

Figure 1:
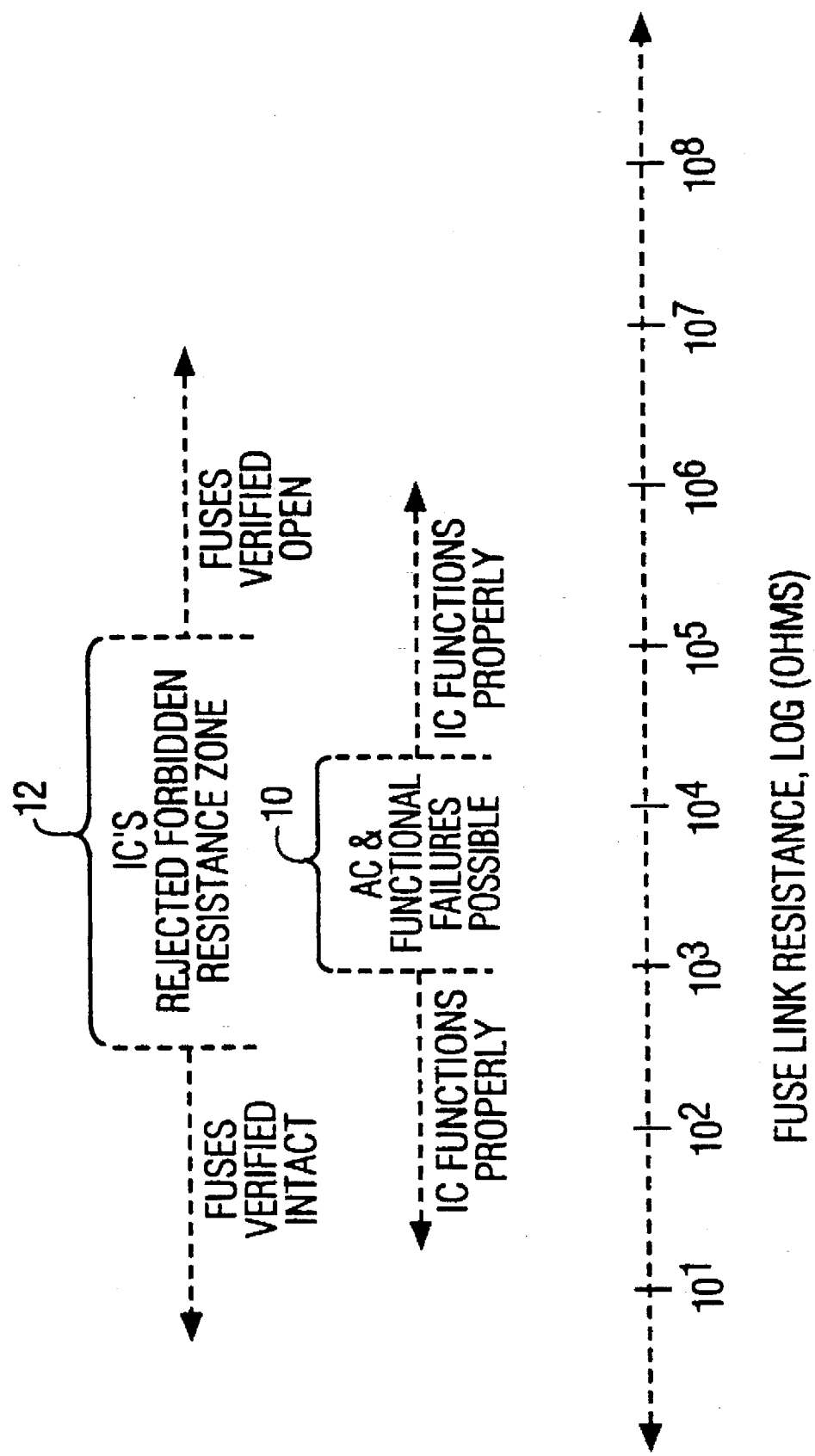
FIG. 1 is a diagram of link resistance value ranges with respect to logarithmic scale.

Referring first to FIG. 1 of the drawing, it has been found experimentally that notwithstanding the prior art use of a single reference resistance value, for example 500 K$\Omega$, to classify the link resistance among one resistance zone corresponding to a "closed" or "intact" state and the other resistance zone corresponding to an "open" state, in fact AC and functional failures are possible in a range 10 including those link resistance values lying in the range of about 1 K$\Omega$ to 50 K$\Omega$. Consequently in accordance with the present invention, an "invalid" or "forbidden" state range 12 of link resistance values is established which is wider than the range 10, and spans between lower and higher reference resistance values, preferably 500$\Omega$ and 100 K$\Omega$, respectively. Then, a "validly closed" state range corresponds to link resistances less than the lower reference resistance value and the "validly open" state range corresponds to link resistances greater than or equal to the higher reference resistance value. Consequently, in accordance with the invention, the prior art verification circuitry for classifying the states of the links as "open" or "closed" is expanded to classify the states of the links as "validly open", "validly closed" or "invalid". A PLD having a link in an "invalid" state is, in general, rejected.

It is noted that the higher and lower reference resistance values are in the ratio of at least 50 to 1 and preferably 200 to 1. As will become clearer as the discussion proceeds, this large ratio necessitates using a current source that produces a predetermined constant higher current through those links having a resistance less than or equal to the lower reference resistance value and a predetermined constant lower current through those links having a resistance greater than or equal to the higher reference resistance value in order to produce test voltages across the links of correct dynamic range.

Figure 2:
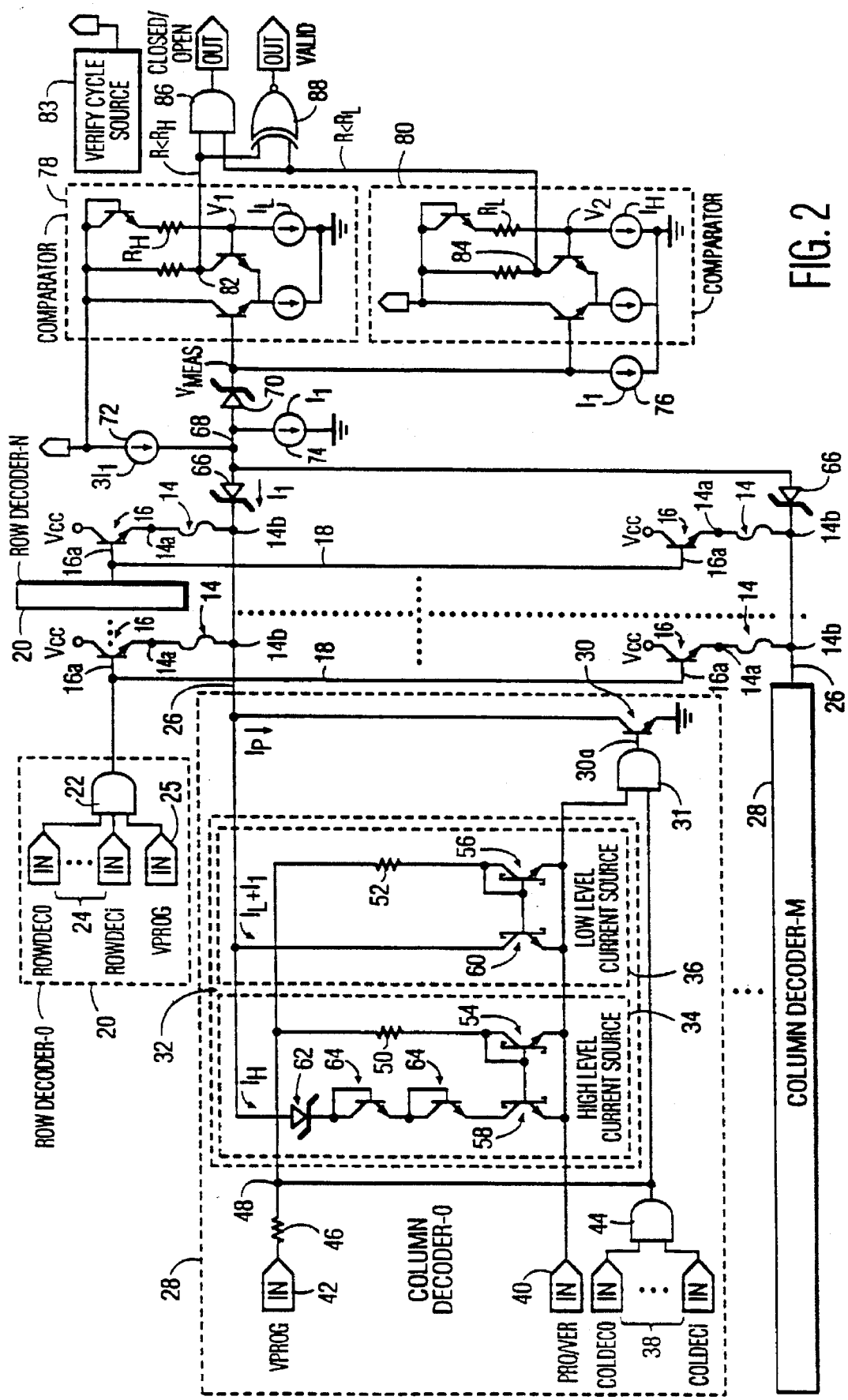
FIG. 2 is a schematic diagram of a first embodiment of the invention implemented using bipolar elements.

Referring to FIG. 2, there is illustrated an embodiment of the invention using bipolar integrated circuit technology. Therein, a plurality of fuse links 14 are shown arranged in a two dimensional array of M+1 rows, numbered 0 to M, by N+1 columns, numbered 0 to N. For purposes of illustration, links 14 are oriented vertically, having an upper terminal 14a and a lower terminal 14b. Further, the array is arranged, for purposes of illustration, with rows oriented vertically and columns oriented horizontally.

Each link 14 has an individual transistor switch 16 connected between the link's upper terminal 14a and a supply voltage source VCC, preferably equal to 5 volts. The base electrodes 16a of the transistor switches 16 connected to links 14 in each same row are connected to a row selection line 18 fed by a row decoder 20 for that row. Each row decoder 20 includes an AND gate 22 which is responsive to a group of parallel inputs 24, which are all digital ONE when the row number corresponding to the row is decoded and a further input signal VPROG at input 25 which is digital ONE to enable programming or verifying the states of the links 10. It should be appreciated that when all inputs to AND gate 22 of a row decoder are digital ONE, all transistor switches 16 controlled by that row decoder are in an ON state.

Similarly, the lower terminals of links 14 in each same column are connected to a column selection line 26 fed by a column decoder 28 for that column. Each column decoder includes a transistor switch 30 for producing a programing current $I_p$ through a selected link 14 to produce sufficient thermal energy in the link to cause it to become "open". Transistor 30 has its base electrode 30a connected to the output of an AND gate 31.

Also included in each column decoder is a switchable two level verification current source 32 including a first portion 34 for producing a relatively high level verification current $I_H$, preferably 1 ma, through the selected link and a second portion 36 for producing a relatively low level verification current $I_L$, preferably 20 $\mu$a, through the selected link. Actually, in order to produce the low level verification current $I_L$ through the selected link, the second portion must actually sink a current equal to $I_L+I_1$, where $I_1$ is the current passing through a Schottky diode 66 coupling each column control line 26 to comparator circuitry which will be later discussed. Each column decoder 28 has a group of parallel inputs 38 which are all digital ONE in response to decoding of the column number corresponding to the column controlled by the column decoder, a PRO/VER input signal on input 40 which is near VCC (digital ONE) to enable programing and near ground (digital ZERO) to enable verification and the signal VPROG on input 42. The latter is near VCC (digital ONE) for programing and for verification. The inputs 38 feed an AND gate 44. A pulsatile signal VPROG on input 42 is coupled via a resistor 46 to a point 48 that is connected to the output of AND gate 44 so as to form a wired AND function. Also, the PRO/VER input signal on input 40 and the output of AND gate 44 are inputs to AND gate 31 controlling transistor switch 30.

The voltage at point 48 forms the supply voltage coupled via resistors 50, 52 to the collectors and bases of Schottky transistors 54, 56 and bases of Schottky transistors 58, 60, in the current source portions 34, 36, respectively. The emitters of the transistors 54, 56, 58, and 60 are all connected to PRO/VER input 40. Transistors 54, 58 and 56, 60 form input and output of current mirror pairs. The resistors 50, 52 and relative widths or number of parallel junctions of the current mirror pairs are chosen to achieve the current $I_H$ in transistor 58 and the current $I_L$ in transistor 60. The collector of output transistor 58 is connected to column control line 26 via the series combination of a Schottky diode 62 and two diodes formed by base to collector commoned transistors 64, while the collector of transistor 56 is directly connected to line 26. The aforementioned series combination produces a fixed voltage drop equal to two Vbe's (one Vbe=approx. 0.75 volts) plus a Schottky drop (approx. 0.5 volts). Consequently, when the voltage on collector control line 26 falls below 2.75 volts, i.e., one Schottky diode drop plus two pn-diode drops plus one saturation voltage above ground, then diode 62 and transistors 64 reverse bias. This stops current $I_H$ and forces transistor 58 to operate near saturation. All current demanded by transistor 58 then is sourced through its Schottky diode clamp from VPROG.

In operation, a link whose state is to be programmed or verified is selected by provision of its row and column locations to row and column decoders 20, 28 and the assertion of a VPROG pulse of digital ONE value. The transistor switches 16 of the selected row are turned on in response to row decoder 20 for that row and the transistor switch 30, for programming, or the two level current source 32, for verification, within the column decoder 28 for the selected column is turned on to sink current from its associated column conductor 26. Two level current source 32 is turned on for verification purposes during the duration of the VPROG pulse when the PRO/VER input is digital ZERO (near ground) while transistor switch 30 is turned on for programing purposes during the duration of the VPROG pulse when the PRO/VER input is digital ONE.

During verification, the current produced through the selected link by two level current source 32 is dependent upon the link resistance. For a link resistance greater than or equal to 75 KΩ (1.5 volts/20 µa), only the lower current level $I_L$ will flow through the selected link, producing a link voltage across the selected link of greater than or equal to 1.5 volts. The voltage at the lower terminal 14b of the selected link and along line 26 and will be less than or equal to 2.75 volts (subtracting 1.5 volts plus one Vbe due to transistor switch 16 from VCC=5 volts), thereby maintaining transistor 58 off preventing any flow of the higher level current $I_H$. At a link resistance equal to the higher reference resistance value $R_H$ of preferably 100 KΩ, the voltage at the lower terminal 14b and conductor 26 will be 2.25 volts, which value is hereafter referred to as the lower reference voltage $V_1$.

For link resistance less than 1.5 KΩ, (1.5 volts/1 ma), the high current level $I_H$ of 1 ma will produce a link voltage of less than 1.5 volts. Consequently, the potential of terminal 14b will greater than 2.75 volts and transistor 58 will never be cut off. At a link resistance equal to the lower reference resistance value $R_L$ of preferably 500Ω, the voltage at lower terminal 14b will be 3.75 volts, the value thereof being referred to as the higher reference voltage $V_2$.

Further, for link resistance between 1.5 KΩ and 75 KΩ, high level current source 34 will act to clamp the voltage of the lower terminal 14b to just below 2.75 volts.

The various column control lines 26 are connected to the cathodes via Schottky diodes 66 whose anodes are connected to a common node 68. The effect of this interconnection is that the voltage at node 68 is due to the voltage at the lower terminal 14b of the selected link. A further Schottky diode whose anode is connected to node 68 forms a measurement voltage $V_{MEAS}$ at its cathode. The diode 66 associated with the selected column and the diode 68 are biased by current sources 72, 74 and 76 to have equal anode to cathode currents $I_1$ and consequently equal and opposite voltages. Therefore, measurement voltage $V_{MEAS}$ is equal to the voltage at the lower terminal 14b of the selected link. The current sources and differential comparators 78 and 80 are powered from a voltage source 83 which is active and equal to VCC only during a verification cycle.

Voltage $V_{MEAS}$ is compared in differential comparator 78 with the lower reference voltage $V_1$, which is formed by passing a current having the value $I_L$ through a resistance having the value $R_H$ which is connected to supply 83 via a Vbe junction. If $V_{MEAS}$ exceeds $V_1$, which means the resistance of the link is less than $R_H$, output 82 of comparator 78 will be high (digital ONE). Similarly, voltage $V_{MEAS}$ is compared in differential comparator 80 with the higher reference voltage $V_2$, which is formed by passing a current having the value $I_H$ through a resistance having the value $R_L$ which is connected to supply 83 via a Vbe junction. If $V_{MEAS}$ exceeds $V_2$, which means the resistance of the link is less than $R_L$, output 82 of comparator 78 will be high (digital ONE).

Outputs 82 and 84 form the inputs of an AND gate 86 and of an Exclusive NOR gate 88. The output of gate 86 is digital ONE when both inputs are digital ONE, which corresponds to the resistance of the link being less than $R_L$. The output of gate 88 is digital one when both inputs have the same digital value, which corresponds to the link resistance being greater than or equal to $R_H$ or less than $R_L$. It should be appreciated that from these two digital outputs, it can be determined whether the state of the link is "validly open" (link resistance greater than or equal to $R_H$), "validly closed" (link resistance less than $R_L$), or "invalid" (link resistance greater than or equal to $R_L$ and less than $R_H$).

Figure 3:
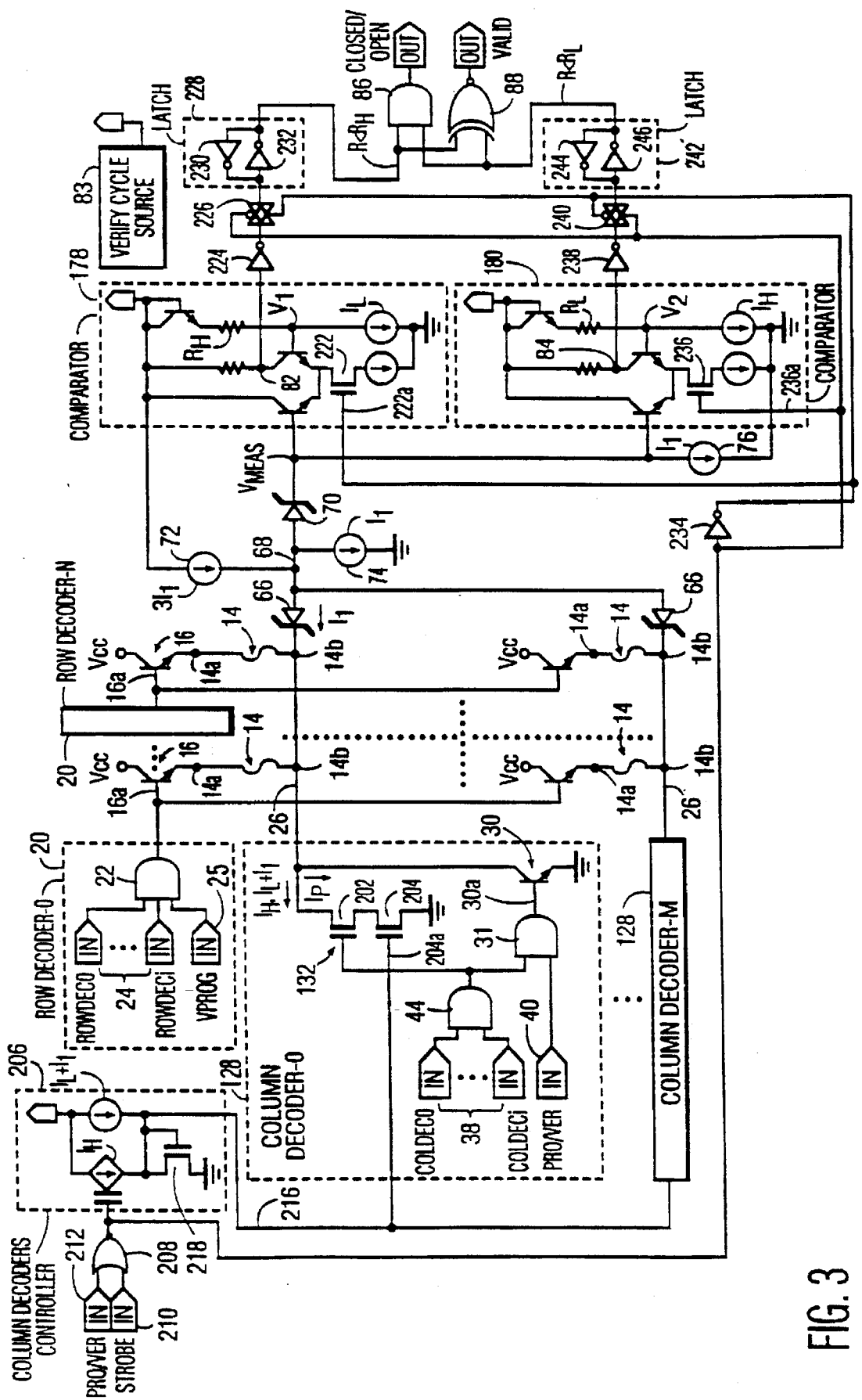
FIG. 3 is a schematic diagram of a second embodiment of the invention implemented using biCMOS elements.

Referring to FIG. 3, there is illustrated an embodiment of the invention using biCMOS integrated circuit technology. Therein, the same reference numerals are used for elements corresponding to the bipolar embodiment shown in FIG. 1. The biCMOS embodiment differs from the bipolar embodiment in the design of the two level verification current source and in the voltage measuring section because the low level current $I_L$ and high level current $I_H$ are sequentially applied through the selected link under the control of a strobe signal and the result of comparison of the resultant two measurement values with the associated voltage reference values $V_1$ and $V_2$ are latched. As will be seen as the discussion proceeds, low level current $I_L$ is produced through the selected link when the strobe signal is low (digital ZERO) while high level current $I_H$ is produced through the selected link when the strobe signal is high (digital ONE).

The switchable two level verification current source 132 within each column decoder is formed by a pair of series connected FET's 202, 204. FET 202 has its gate electrode connected to output of AND gate 44 turning FET 202 on when the selected column is decoded by AND gate 44. The gate electrodes 204a of FET's 204 are connected together and are fed by line 216 output from column decoders controller 206. Controller 206 controls the current through a FET 218 to selectively add a high current $I_H$ to the low current $I_L+I_1$ flowing in the drain to source path of FET 218. Line 216, connected to the commoned drain and gate of FET 216 has a voltage which causes FET 204 to have a drain to source current mirroring the current flowing in FET 218. Controller 206 is responsive to the output of an NOR gate 208 which receives a strobe signal on input 210 and the PRO/VER signal on input 212. It includes a voltage controlled current source 214 between voltage source 83 and line 216 producing $I_H$, FET 218 between line 216 and ground, and current source 220 between source 83 and line 216 producing the low current $I_L+I_1$. Current due to $I_L+I_1$ flows into the drain to source path of FET 218 whenever voltage source 83 is active, irrespective of the state of the strobe signal. Since the PRO/VER signal is digital ZERO during verification, as long as the strobe signal is digital ZERO, the output of NOR gate 208 will be digital ZERO. The current source 214 will be off and solely The current $I_L+I_1$ will flow in the drain to source path of FET 218, and by current mirror action, also in the drain to source path of FET 204.

When the strobe signal goes to digital ZERO, the output of NOR gate 208 will go to digital ONE turning on upper current source 214 and thereby adding $I_H$ to the current flowing in the drain to source path of FET 218. Current mirror action will cause $I_H$ to flow in the drain to source path of FET 204 in addition to the much smaller $I_1+I_1$.

For comparing the measurement voltage $V_{MEAS}$ produced when the strobe signal is high with the lower reference value $V_1$, a comparator 178 is provided which is identical to comparator 78 in FIG. 2 except that a FET 222 is located for selectively activating comparator 178 when it is turned on. The gate electrode 222a of FET 222 is fed from the output of NOR gate 208, via an inverter 234, thereby turning FET 222 on when the output of NOR gate 208 is digital ZERO, which is when the strobe signal has not gone to digital ZERO. The output 82 of comparator 178 is applied via the series combination of an inverter 224 and gate element 226 to a latch 228 formed by cross coupled inverters 230, 232. Gate element 226, which is controlled by two complementary inputs, one directly from the output of NOR gate 208 and the other via an inverter 234, is on when FET 22 is on.

Similarly, for comparing the measurement voltage $V_{MEAS}$ produced when the strobe signal is low with the lower reference value $V_2$, a comparator 180 is provided which is identical to comparator 80 in FIG. 2 except that a FET 236a is located for selectively activating comparator 180 when it is turned on. The gate electrode 236a of FET 236 is fed directly from the output of NOR gate 208, thereby turning FET 236 on when the output of NOR gate 208 is digital ONE, which is when the strobe signal goes to digital ZERO. The output 84 of comparator 180 is applied via the series combination of an inverter 224 and gate element 240 to a latch 242 formed by cross coupled inverters 244, 246. Gate element 240, which is controlled opposite complementary inputs to gate element 226, is on when FET 236 is on.

The output of latch 228 is digital ONE when the link resistance, as measured when the strobe is digital ONE, is less than the higher reference resistance value $R_H$. Similarly, the output of latch 242 is digital ONE when the link resistance, as measured when the strobe is digital ZERO, is less than the lower reference resistance value $R_L$. These outputs are applied to AND gate 86 and exclusive NOR gate 88, as in the embodiment shown in FIG. 1 to produce two digital outputs, one of which indicates whether or not the state of the selected link is valid and the other which effectively gives the result of a comparison with at least one of the reference resistance values.

It should be understood that while the present invention has described in detail with respect to bipolar and biCMOS embodiments, other embodiments are possible within the intended spirit and scope of the invention. Further, numerous modifications are possible with respect to the embodiments described.

What is claimed is:

1. A programmable logic device comprising:
    a memory array of elements, each element having an electrical property, describable by a parameter, which is alterable from an initial condition in response to an application of energy directed to the element;
    means for programming the memory array by applying energy directed to one or more elements of the array to attempt to produce a desired pattern in the array of said one or more elements having the values of their respective parameters lying in a first range of values and the other elements having the values of their respective parameters lying in a second range, there being a forbidden range of values of the parameter which is intermediate to the first and second ranges; and
    verification means for including a selected one of the elements in an electrical circuit and for in response to an electrical quantity in said circuit forming one or more digital signals from which it is determinable whether or not the value of the parameter of said element lies in the forbidden range;
    wherein said elements are links, said parameter is one of link resistance and conductance, and said first range comprises values less than a lower reference value, said second range comprises values greater than a higher reference value, and said forbidden range comprises values between said lower and higher reference values, a ratio of said higher reference value to said lower reference value being at least 50 to 1.

2. The programmable logic device as claimed in claim 1, wherein said device is an integrated circuit.

3. The programmable logic device as claimed in claim 1, wherein it is determinable from the one or more digital signals formed by the verification means, which of said first, second and forbidden ranges, the value of the parameter of the selected element lies in.

4. The programmable logic device as claimed in claim 3, wherein said device is an integrated circuit.

5. The programmable logic device as claimed in claim 4, wherein said parameter is resistance, said quantity is a voltage, and said verification means comprises said switchable two-level current source producing a predetermined constant higher current through said circuit if the selected link has a resistance no more than the lower reference value and a predetermined constant lower current if the selected link has a resistance no less than the higher reference value.

6. The programmable logic device as claimed in claim 5, wherein a ratio of said higher current to said lower current is at least 12.5 to 1.

7. The programmable logic device as claimed in claim 1, wherein said parameter is resistance, said quantity is a voltage, and said verification means comprises said switchable two-level current source producing a predetermined constant higher current through said circuit if the selected link has a resistance no more than the lower reference value and a predetermined constant lower current if the selected link has a resistance no less than the higher reference value.

8. The programmable logic device as claimed in claim 7, wherein a ratio of said higher current to said lower current is at least 12.5 to 1.

9. The programmable logic device as claimed in claim 1, wherein said verification means comprises a switchable two-level current source connectable to said selected element for providing a current level to said selected element as a function of the value of the parameter of said selected element.

10. An electronic circuit comprising:
    a memory array of programmable elements, each element having an electrical property which is describable by a parameter and which is alterable from an unprogrammed condition in response to an application of energy directed to the element, wherein the parameter has a first value lying in a first range of values when the element is unprogrammed, and a second value lying in a second range of values when the element is successfully programmed; and verification means for selectively and reversibly including a selected one of the elements in a verification circuit and for providing one or more signals indicative of whether or not the value of the parameter of the selected element lies in a forbidden range of values of the parameter intermediate to the first and second ranges, the verification circuit comprising first and second current sources arranged in parallel and being connectable to the selected element for providing first and second currents, respectively, in dependence on the parameter value associated with the selected element.

* * * * *